United States Patent
Yang et al.

(10) Patent No.: US 8,782,487 B2
(45) Date of Patent: Jul. 15, 2014

(54) SYSTEMS AND METHODS FOR LOCATING AND CORRECTING DECODER MIS-CORRECTIONS

(75) Inventors: Shaohua Yang, Santa Clara, CA (US); Yang Han, Sunnyvale, CA (US); Chung-Li Wang, San Jose, CA (US); Mikhail I. Grinchuk, San Jose, CA (US); Anatoli A. Bolotov, San Jose, CA (US); Lav D. Ivanovic, Sunnyvale, CA (US)

(73) Assignee: LSI Corporation, San Jose, CA (US)

( * ) Notice: Subject to any disclaimer, the term of this patent is extended or adjusted under 35 U.S.C. 154(b) by 132 days.

(21) Appl. No.: 13/450,289

(22) Filed: Apr. 18, 2012

(65) Prior Publication Data

US 2013/0283114 A1    Oct. 24, 2013

(51) Int. Cl.
| | |
|---|---|
| H03M 13/00 | (2006.01) |
| G06F 11/00 | (2006.01) |
| H04L 1/00 | (2006.01) |
| G11C 29/00 | (2006.01) |
| H03M 13/41 | (2006.01) |
| H03M 13/37 | (2006.01) |
| H03M 13/09 | (2006.01) |
| H03M 13/11 | (2006.01) |
| H03M 7/30 | (2006.01) |
| G11B 20/18 | (2006.01) |

(52) U.S. Cl.
CPC ............ *H03M 13/00* (2013.01); *H03M 13/41* (2013.01); *H03M 13/3746* (2013.01); *H03M 13/093* (2013.01); *H03M 13/1102* (2013.01); *H03M 13/1108* (2013.01); *H03M 13/1128* (2013.01); *H03M 13/3723* (2013.01); *H03M 13/6511* (2013.01); *H03M 13/6513* (2013.01); *H03M 7/6005* (2013.01); *G11B 20/1833* (2013.01); *G11B 2020/1843* (2013.01); *G11B 2020/185* (2013.01); *G11B 2220/2516* (2013.01)

USPC .......... 714/758; 714/746; 714/752; 714/763; 714/773; 714/799; 714/780; 714/786; 714/800

(58) Field of Classification Search
CPC ................. G11B 20/1833; G11B 2020/1843; G11B 2020/185; G11B 2220/2516; G11B 2220/415; G11B 20/01; H03M 13/00; H03M 13/41; H03M 13/3746; H03M 13/093; H03M 13/1102; H03M 13/1108; H03M 13/1128; H03M 13/3723; H03M 13/6511; H03M 13/6513; H03M 7/6005

USPC ......... 714/746, 752, 758, 763, 773, 799, 780, 714/786, 800

See application file for complete search history.

(56) References Cited

U.S. PATENT DOCUMENTS

| | | | | |
|---|---|---|---|---|
| 5,222,069 A | * | 6/1993 | Chevalley | 714/765 |
| 5,731,922 A | * | 3/1998 | Yamasaki et al. | 360/53 |

(Continued)

FOREIGN PATENT DOCUMENTS

| | | | | | |
|---|---|---|---|---|---|
| JP | 06046406 A | * | 2/1994 | | H04N 7/137 |

OTHER PUBLICATIONS

Kang et al., "A Two-Stage Iterative Decoding of LDPC Codes for Lowering Error Floors", IEEE GLOBECOM Proceedings, 1088-1091 (2008).

(Continued)

*Primary Examiner* — John J Tabone, Jr.
(74) *Attorney, Agent, or Firm* — Hamilton DeSanctic & Cha (57) ABSTRACT

Various embodiments of the present invention provide systems and methods for data processing. For example, data processing systems are disclosed that include a data decoding circuit having a data decoder circuit, an element modification circuit, an element modification log, and a mis-correction detection circuit.

20 Claims, 3 Drawing Sheets

(56) References Cited

U.S. PATENT DOCUMENTS

| | | | |
|---|---|---|---|
| 6,272,659 B1 * | 8/2001 | Zook | 714/774 |
| 6,438,724 B1 * | 8/2002 | Cox et al. | 714/758 |
| 6,446,234 B1 * | 9/2002 | Cox et al. | 714/758 |
| 6,493,846 B1 * | 12/2002 | Kondo et al. | 714/794 |
| 6,694,477 B1 * | 2/2004 | Lee | 714/784 |
| 6,810,094 B1 * | 10/2004 | Lu | 375/341 |
| 6,847,601 B2 * | 1/2005 | Kanai et al. | 369/59.17 |
| 7,178,086 B2 * | 2/2007 | Hassner et al. | 714/758 |
| 7,395,491 B2 * | 7/2008 | Chen | 714/780 |
| 7,685,497 B2 * | 3/2010 | Kons | 714/759 |
| 8,020,069 B1 * | 9/2011 | Feng et al. | 714/758 |
| 8,230,292 B2 * | 7/2012 | Fujiwara et al. | 714/752 |
| 8,370,711 B2 * | 2/2013 | Alrod et al. | 714/763 |
| 8,381,069 B1 * | 2/2013 | Liu | 714/759 |
| 8,429,498 B1 * | 4/2013 | Anholt et al. | 714/764 |
| 8,458,555 B2 * | 6/2013 | Gunnam | 714/752 |
| 8,495,462 B1 * | 7/2013 | Liu | 714/759 |
| 8,495,479 B1 * | 7/2013 | Varnica et al. | 714/794 |
| 8,527,849 B2 * | 9/2013 | Jakab et al. | 714/780 |
| 8,560,900 B1 * | 10/2013 | Bellorado et al. | 714/718 |
| 2009/0161245 A1 * | 6/2009 | Mathew et al. | 360/65 |
| 2010/0042890 A1 | 2/2010 | Gunnam et al. | |
| 2010/0287436 A1 * | 11/2010 | Lastras-Montano et al. | 714/752 |
| 2011/0041040 A1 * | 2/2011 | Su et al. | 714/773 |
| 2012/0005551 A1 | 1/2012 | Gunnam et al. | |
| 2012/0185744 A1 * | 7/2012 | Varnica et al. | 714/752 |
| 2013/0024740 A1 * | 1/2013 | Xia et al. | 714/746 |
| 2013/0031440 A1 * | 1/2013 | Sharon et al. | 714/758 |
| 2013/0198580 A1 * | 8/2013 | Chen et al. | 714/752 |
| 2013/0238955 A1 * | 9/2013 | D'Abreu et al. | 714/763 |
| 2013/0254619 A1 * | 9/2013 | Zhang et al. | 714/755 |

OTHER PUBLICATIONS

U.S. Appl. No. 13/363,751, Unpublished (filed Feb. 1, 2012) (Lei Chen).

U.S. Appl. No. 13/284,754, Unpublished (filed Oct. 28, 2011) (Fan Zhang).

* cited by examiner

SYSTEMS AND METHODS FOR LOCATING AND CORRECTING DECODER MIS-CORRECTIONS

BACKGROUND OF THE INVENTION

The present inventions are related to systems and methods for data processing, and more particularly to systems and methods for correcting mis-corrections.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function receives data sets and applies a data decode algorithm to the data sets to recover an originally written data set. In some cases, application of the data decoding process provides a correct result for internal decoder metrics suggesting that the result is correct when in fact it is not. Such mis-corrections can be difficult to detect and may be fatal to the operation of a recipient device.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for correcting mis-corrections.

Various embodiments of the present invention provide data processing systems that include a data decoding circuit. The data decoding circuit includes a data decoder circuit, an element modification circuit, an element modification log, and a mis-correction detection circuit. The data decoder circuit is operable to: apply a data decode algorithm to a decoder input to yield a decoded output, apply the data decode algorithm to the decoder input guided by the decoded output to yield a first updated decoded output, and apply the data decode algorithm to the decoder input guided by a second updated decoded output decoded output to yield a third updated decoded output. The element modification circuit is operable to modify at least one element within the first updated decoded output to yield the second updated decoded output, and the element modification log is operable to maintain a history of one or more modified elements within the second updated decoded output. The mis-correction detection circuit is operable to identify a mis-correction in the third updated decoded output and to return at least one of the modified elements in the third updated decoded output to a prior state to yield a fourth updated decoded output. The data decoder circuit is further operable to apply the data decode algorithm to the decoder input guided by the fourth updated decoded output to yield a fifth updated decoded output.

In some instances of the aforementioned embodiments, the mis-correction detection circuit uses cyclic redundancy check information in the third updated decoded output to identify the mis-correction. In one or more instances of the aforementioned embodiments, the data decoder circuit is a low density parity check decoder circuit, and the data decode algorithm is a low density parity check decode algorithm. In particular instances of the aforementioned embodiments, the mis-correction detection circuit is further operable to modify soft data associated with the at least one of the modified elements to discourage future modification of the at least one of the modified elements. In some such instances, the soft data is log likelihood ratio data. In various such instances, the mis-correction detection circuit is further operable to modify soft data associated with at least one element other than the at least one of the modified elements to encourage future modification of the at least one element other than the at least one of the modified elements.

In one or more instances of the aforementioned embodiments, an element may be, but is not limited to, a bit or a symbol. In some instances of the aforementioned embodiments, the data processing system is implemented as part of a storage device. In other instances, the data processing system is implemented as part of a receiving device. In various instances of the aforementioned embodiments, the data processing system is implemented as part of an integrated circuit. In some instances of the aforementioned embodiments, the data processing system further includes a data detector circuit operable to apply a data detection algorithm to an input data set to yield a detected output. In such instances, the decoder input is derived from the detector output.

Other embodiments of the present invention provide methods for data processing that include: applying a data decode algorithm to decoder input guided by a first updated decoded output by a data decoder circuit to yield a second updated decoded output; modifying at least one element of the second updated decoded output to yield a third updated decoded output; storing a history including the modified one of the at least one element of the second updated decoded output to a memory; applying the data decode algorithm to the decoder input guided by the third updated decoded output to yield a fourth updated decoded output wherein the fourth updated decoded output includes a mis-correction; accessing the history from the memory; based at least in part on the history, reversing the modification of the at least one element of the second updated decoded output to yield a fifth updated decoded output; and applying the data decode algorithm to the decoder input guided by the fifth updated decoded output to yield a sixth updated decoded output.

In some cases, the methods further include identifying the mis-correction using cyclic redundancy check information in the fourth updated decoded output. In various cases, the data decoder circuit is a low density parity check decoder circuit, and the data decode algorithm is a low density parity check decode algorithm. In particular cases, the methods further include modifying soft data associated with the at least one element of the second updated decoded output to discourage future modification of the at least one element of the second updated decoded output. In one or more cases, the methods further include modifying soft data associated with at least one element other than the at least one element of the second updated decoded output to encourage future modification of the at least one element other than the at least one element of the second updated decoded output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some

DETAILED DESCRIPTION OF THE INVENTION

The present inventions are related to systems and methods for data processing, and more particularly to systems and methods for correcting mis-corrections.

Various embodiments of the present invention provide data processing systems that include a combination data decoder circuit that includes a low density parity check decoder circuit, a bit determination and modification circuit, a modification log memory, and a mis-correction detection and modification rewind circuit that together are used to identify a mis-correction and to correct the identified mis-correction. As just one of many advantages, the aforementioned systems perform low density parity check decoding until a bit modification condition is met. When the bit modification condition is met, one or more bits of the current decoded output are flipped and the flipped bits are logged. The low density parity check decode algorithm is re-applied to the decoded output including the flipped bits to yield an updated decoded output. This process continues until either a timeout occurs or until the decoded output converges (i.e., all parity checks are satisfied).

Once the decoded output converges, the mis-correction detection and modification rewind circuit determines whether the decoded output includes a mis-correction. In some cases, the mis-correction is identified using cyclic redundancy correction bits included in the decoded output. Where a mis-correction is determined, one or more of the previously flipped bits in the decoded output are returned to their earlier condition (i.e., rewind) based upon information in the modification log memory. The soft data associated with these "rewound" bits is increased to reduce the possibility of the bits being flipped again, and the process of bit modification is repeated and the low density parity check decoder algorithm is applied to the decoded output with the newly flipped bits. As used herein, the term "flipped bit" is used in its broadest sense to mean a bit flipped during a local iteration immediately prior to convergence of a data output, or a bit flipped over defined local iterations. For example, a flipped bit may be a bit modified during k to k+m local iterations where k and m are specified or automatically swept through based on logged decoder information. Based upon the disclosure herein, one of ordinary skill in the art will recognize a variety of flipped bits that may be used in relation to different embodiments of the present invention.

The bit modification may be done using any bit modification algorithm known in the art. As one example, the bit modification may be done in accordance with that disclosed in U.S. patent application Ser. No. 13/284,754 entitled "Systems and Methods for Ambiguity Based Decode Algorithm Modification" and filed by Zhang et al. on Oct. 28, 2011. Alternatively, the bit modification may be done in accordance with that disclosed in U.S. patent application Ser. No. 13/274,443 entitled "LDPC Decoder with Targeted Symbol Flipping" and filed by Wang et al. on Oct. 17, 2011. The entirety of both of the aforementioned references is incorporated herein by reference for all purposes. Based upon the disclosure provided herein, one of ordinary skill in the art will recognize a variety of bit modification algorithms and/or circuitry that may be used in relation to different embodiments of the present invention.

Figure 1:
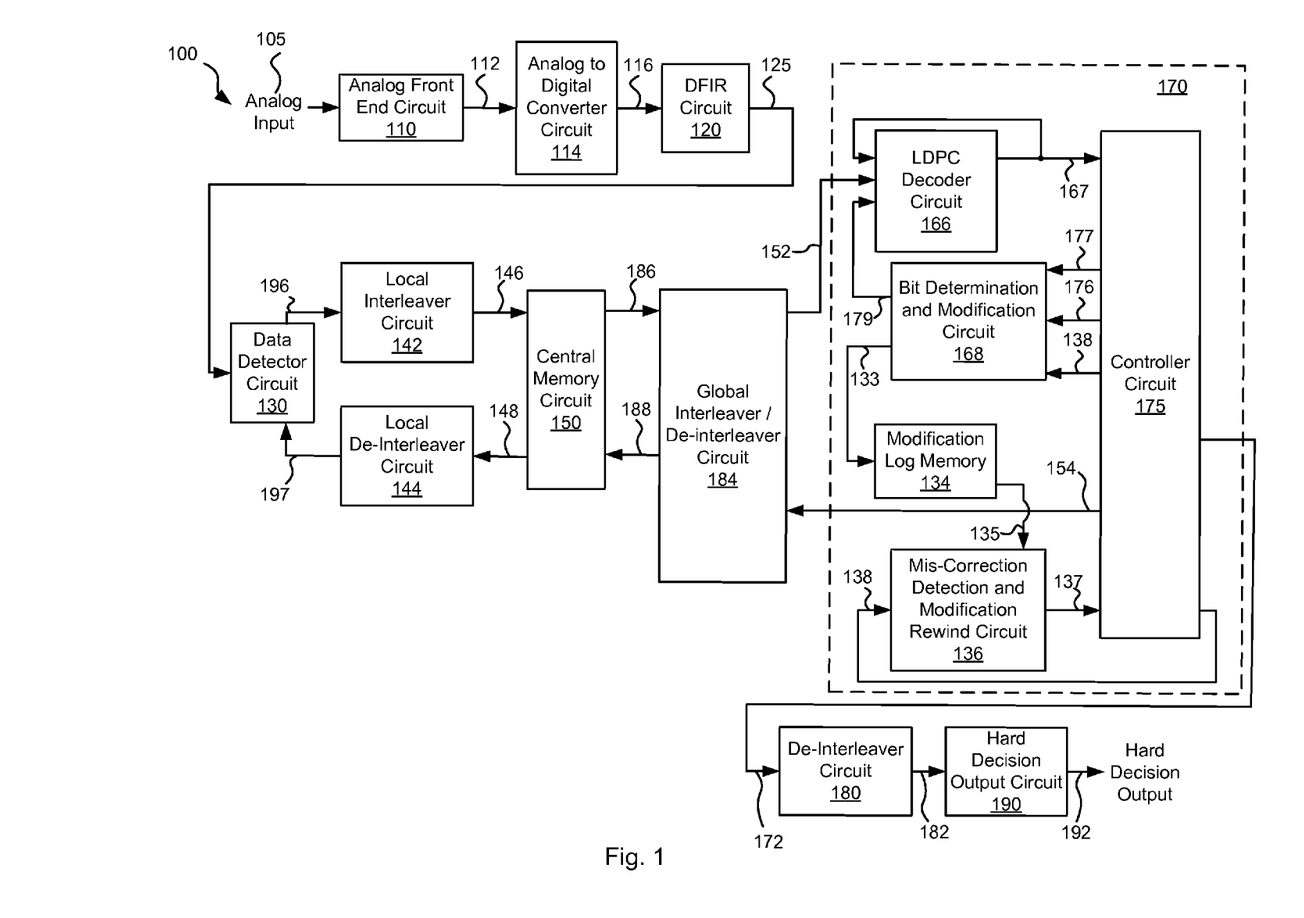
FIG. 1 shows a data processing circuit including a combination data decoder operable to correct mis-corrections in accordance with one or more embodiments of the present invention.

Turning to FIG. 1, a data processing circuit 100 is shown that includes a data decoding circuit 170 including a combination of a low density parity check decoder circuit 166, a bit determination and modification circuit 168, a modification log memory 134, and a mis-correction detection and modification rewind circuit 136 in accordance with one or more embodiments of the present invention. Data processing circuit 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. In some cases, equalizer circuit 120 includes sufficient memory to maintain one or more codewords until a data detector circuit 130 is available for processing, and for multiple processes through data detector circuit 130.

Data detector circuit 130 is operable to apply a data detection algorithm to a received codeword or data set, and in some cases data detector circuit 130 can process two or more codewords in parallel. In some embodiments of the present invention, data detector circuit 130 is a Viterbi algorithm data detector circuit as are known in the art. In other embodiments of the present invention, data detector circuit 130 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 130 is started based upon availability of a data set from equalizer circuit 120 or from a central memory circuit 150.

Upon completion, data detector circuit 130 provides a detector output 196. Detector output 196 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 196 is provided to a local interleaver circuit 142. Local interleaver circuit 142 is operable to shuffle sub-portions (i.e., local chunks) of the data set included as detected output and provides an interleaved codeword 146 that is stored to central memory circuit 150. Interleaver circuit 142 may be any circuit known in the art that is capable of shuffling data sets to yield a re-arranged data set. Interleaved codeword 146 is stored to central memory circuit 150.

Once a data decoding circuit 170 is available, a previously stored interleaved codeword 146 is accessed from central memory circuit 150 as a stored codeword 186 and globally interleaved by a global interleaver/de-interleaver circuit 184. Global interleaver/De-interleaver circuit 184 may be any circuit known in the art that is capable of globally rearranging codewords. Global interleaver/De-interleaver circuit 184 provides a decoder input 152 input to data decoding circuit 170.

Data decoding circuit 170 includes low density parity check decoder circuit 166, bit determination and modification circuit 168, modification log memory 134, and mis-correction detection and modification rewind circuit 136. Low density parity check decoder circuit 166 applies a low density parity check decoding algorithm to decoder input 152 to yield a decoded output 167 and unsatisfied check equation identification 169 to a controller circuit 175. In addition, decoder output 167 is fed back to low density parity check decoder circuit 166 where it can be used to guide subsequent application of the decoder algorithm to decoder input 152.

Controller circuit 175 utilizes decoder output 167 and unsatisfied check equation identification 169 to determine whether decoder output 167 converged (i.e., all parity check equations were satisfied). Where decoder output 167 converged unsatisfied check equation identification 169 does not indicate any unsatisfied checks. Where decoder output 167 failed to converge, it is determined by controller circuit 175 whether a bit modification condition has been met. In some cases, a bit modification condition is found to be met where the number of remaining unsatisfied checks after application of the decoder algorithm by low density parity check decoder circuit 166 to decoder input 152 is less than ten, and the indexes corresponding to the remaining unsatisfied checks (i.e., unsatisfied check equation identification 169) have not changed for at least two local iterations (i.e., passes through low density parity check decoder circuit 166). In addition, in some cases, controller circuit 175 is not enabled to indicate a that the bit modification condition has been met until at least four local iterations of the low density parity check decoder algorithm applied to decoder input 152 have completed. Based upon the disclosure provided herein, one of ordinary skill in the art will recognize other indicia that may be used to define the occurrence of a bit modification condition.

Where the data decoding algorithm as applied by low density parity check decoder circuit 166 failed to converge and no more local iterations (iterations through low density parity check decoder circuit 166) are allowed, controller circuit 175 provides a decoder output 154 (i.e., decoder output 167) back to central memory circuit 150 via global interleaver/de-interleaver circuit 184. Prior to storage of decoded output 154 to central memory circuit 150, decoded output 154 is globally de-interleaved to yield a globally de-interleaved output 188 that is stored to central memory circuit 150. The global de-interleaving reverses the global interleaving earlier applied to stored codeword 186 to yield decoder input 152. Once data detector circuit 130 is available, a previously stored de-interleaved output 188 is accessed from central memory circuit 150 and locally de-interleaved by a de-interleaver circuit 144. De-interleaver circuit 144 re-arranges decoder output 148 to reverse the shuffling originally performed by interleaver circuit 142. A resulting de-interleaved output 197 is provided to data detector circuit 130 where it is used to guide subsequent detection of a corresponding data set receive as equalized output 125.

Alternatively, where the data decoding algorithm applied by low density parity check decoder circuit 166 failed to converge, more local iterations (iterations through low density parity check decoder circuit 166) are allowed, and the aforementioned bit modification condition is met, controller circuit 175 provides a soft data subset 177 corresponding to a portion of decoder output 167 related to unsatisfied parity checks indicated by unsatisfied check equation identification 176 (i.e., a pass through of unsatisfied check equation identification 169) to bit determination and modification circuit 168. Bit determination and modification circuit 168 is operable to determine one or more probable bits or symbols associated with the remaining unsatisfied checks to be modified. The identified bits or symbols are then modified by bit determination and modification circuit 168 and provided as a replacement symbol output 179 where it is used to replace the corresponding symbol in decoder output 167 for a subsequent iteration through low density parity check decoder circuit 166. The bit modification algorithm may be any bit modification algorithm known in the art. As one example, the bit modification may be done in accordance with that disclosed in "Systems and Methods for Ambiguity Based Decode Algorithm Modification" filed by Zhang et al. on Oct. 28, 2011; or with that disclosed in "LDPC Decoder with Targeted Symbol Flipping" filed by Wang et al. on Oct. 17, 2011. The entirety of both of the aforementioned references was previously incorporated herein by reference for all purposes. Based upon the disclosure provided herein, one of ordinary skill in the art will recognize a variety of bit modification algorithms and/or circuitry that may be used in relation to different embodiments of the present invention.

In addition, a modified bit output 133 is provided to modification log memory 134 that records the bits or symbols that are modified in the order that the modification occurred. This order indicates the particular local iteration through low density parity check decoder circuit 166 when the particular bit(s) or symbol(s) were modified. As described below, this logged information can be used to rewind earlier bit modification when a mis-correction is identified. The process of applying the low density parity check equation including, where applicable, performing bit modification is done until either a timeout condition occurs or decoded output 167 converges. The timeout condition may include, but is not limited to an exhausting of a maximum number of local iterations (i.e., passes through low density parity check decoder circuit 166) or global iterations (i.e., passes through a combination of data detector circuit 130 and data decoding circuit 170.

Where decoder output 167 converges, controller circuit 175 provides it to mis-correction detection and modification rewind circuit 136 as a decoder output 138. Mis-correction detection and modification rewind circuit 136 uses cyclic redundancy correction bits included in decoder output 138 to assure that the corresponding cyclic redundancy checks are satisfied. A mis-correction has occurred where the cyclic redundancy checks are not satisfied. As used herein, the term "mis-correction" is used in its broadest sense to mean any modification made during application of the decoding algorithm that satisfied decoding requirements, but does not satisfy another external check. In one particular embodiment of the present invention, a mis-correction occurs where a low density parity check algorithm applied by low density parity check decoder circuit 166 is satisfied, but a cyclic redundancy check applied by mis-correction detection and modification rewind circuit 136 is not satisfied. One example of a mis-correction is described below in relation to a correct codeword (i.e., c), a mis-correction (i.e., e) or difference from the correct codeword, and a parity check matrix (i.e., H). A mis-correction occurs where the following are true:

H*c=0 (i.e., all of the parity check equations in H are satisfied by c);
H*e=0 (i.e., all of the parity check equations in H are satisfied by e); and
H*(c+e)=0 (i.e., all of the parity check equations in H are satisfied by the sum of c+e).

Where a mis-correction is identified by mis-correction detection and modification rewind circuit 136, mis-correction detection and modification rewind circuit 136 identifies one or more bits or symbols within modification log memory 134 to be reversed. The selected bits or symbols may be selected from the most recent local iteration or from a preceding local iteration through low density parity check decoder circuit 166. The previously modified bits or symbols are identified to mis-correction detection and modification rewind circuit 136 as a modified bit indicator output 135. In some embodiments of the present invention, mis-correction detection and modification rewind circuit 136 identifies the bits or symbols that are to be reversed as those bits that have been previously modified (i.e., w) that are associated with the identified mis-correction (i.e., e) in decoded output 138. These identified bits or symbols are indicated to controller circuit 175 as a mis-correction identification output 137.

Based upon mis-correction identification output 137, controller circuit 175 returns the identified bits or symbols to their pre-modification values, and discourages future modification of the same bits or symbols by increasing the soft data values associated with the respective bits or symbols. The processes of bit modification as applied by bit determination and modification circuit 168 and application of the low density parity check decoding algorithm by low density parity check decoder circuit 166 is repeated with the increased soft data values discouraging resolution of decoded output 167 to the earlier decoded output including the mis-corrections. In some cases, soft data surrounding the identified bits or symbols is reduced to further discourage resolution of decoded output 167 to the earlier decoded output including the mis-corrections.

Alternatively, where a mis-correction is not identified by mis-correction detection and modification rewind circuit 136, controller circuit 175 provides the converged decoded output 167 as an output codeword 172 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order data sets that may complete out of order back into their original order. The originally ordered data sets are then provided as a hard decision output 192.

Figure 2:
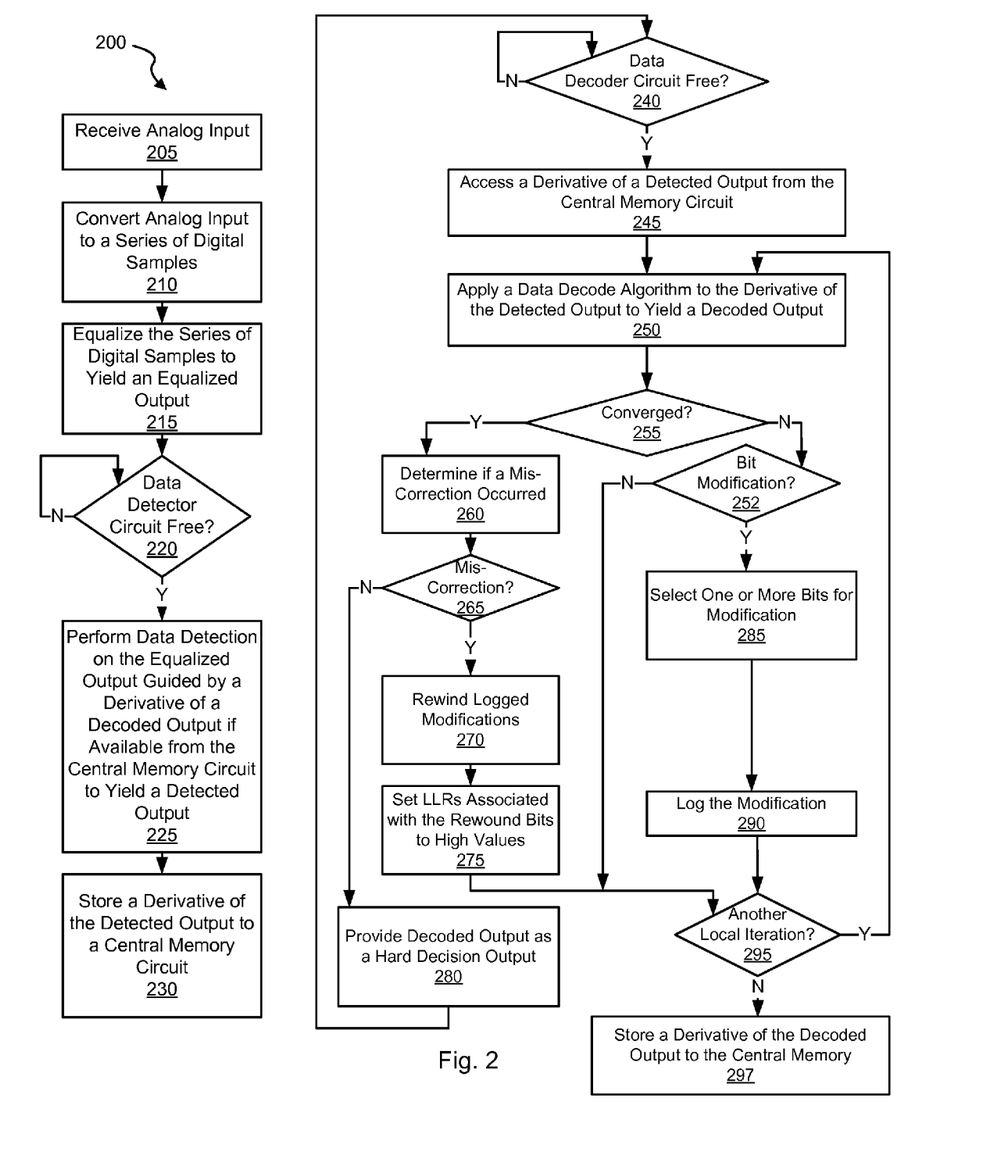
FIG. 2 is a flow diagram showing method for identifying and correcting mis-corrections in accordance with one or more embodiments of the present invention.

Turning to FIG. 2, a flow diagram 200 shows a method for identifying and correcting mis-corrections in accordance with one or more embodiments of the present invention. Following flow diagram 200, an analog input is received (block 205). The analog input may be derived from, for example, a storage medium or a data transmission channel. Based upon the disclosure provided herein, one of ordinary skill in the art will recognize a variety of sources of the analog input. The analog input is converted to a series of digital samples (block 210). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 215). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 220). Where a data detector circuit is available (block 220), a data detection algorithm is applied to the equalized output guided by a data set derived from a decoded output where available (e.g., the second and later iterations through the data detector circuit and the data decoder circuit) from a central memory circuit to yield a detected output (block 225). In some embodiments of the present invention, data detection algorithm is a Viterbi algorithm as are known in the art. In other embodiments of the present invention, the data detection algorithm is a maximum a posteriori data detector circuit as are known in the art. The data set derived from the decoded output maybe a de-interleaved version of the decoded data set. A signal derived from the detected output (e.g., a locally interleaved version of the detected output) is stored to the central memory to await processing by a data decoder circuit (block 230).

In parallel to the previously discussed data detection processing, it is determined whether a data decoder circuit is available (block 240). Where the data decoder circuit is available (block 240), a previously stored derivative of a detected output is accessed from the central memory (block 245). A low density parity check decode algorithm is applied to the derivative of the detected output to yield a decoded output (block 250). It is determined whether the decoded output converged (block 255). Convergence occurs where all of the parity checks applied as part of applying the low density parity check decoding algorithm are satisfied.

Where the decoded output failed to converge (block 255), it is determined whether a bit modification condition has been met (block 252). In some cases, a bit modification condition is found to be met where the number of remaining unsatisfied checks after application of the decoder algorithm is less than ten, and the particular parity equations central to the remaining unsatisfied checks have not changed for at least two local iterations (i.e., passes through application of the low density parity check algorithm). In addition, in some cases, the bit modification condition is not enabled to occur until at least four local iterations applying the low density parity check algorithm have completed. Based upon the disclosure provided herein, one of ordinary skill in the art will recognize other indicia that may be used to define the occurrence of a bit modification condition.

Where the bit modification condition has not occurred (block 252), it is determined whether another local iteration is to be performed (block 295). In some cases, this is determined by comparing the number of local iterations that have been completed to a defined threshold number. Where another local iteration is not called for or allowed (e.g., the number of local iterations equals a maximum number of local iterations) (block 295), the decoded output is stored to the central memory circuit where it awaits processing by the data detector circuit (i.e., another global iteration) (block 297). Otherwise, where it is determined that another local iteration is called for or allowed (e.g., the number of local iterations is not equal to a maximum number of local iterations)(block 295), the processes of blocks 250-297 are repeated for the same data set using the previous decoded output as a guide.

Alternatively, where the bit modification condition has occurred (block 252), one or more bits or symbols within the decoded output are selected for modification (block 285). The bit modification algorithm may be any bit modification algorithm known in the art. As one example, the bit modification may be done in accordance with that disclosed in "Systems and Methods for Ambiguity Based Decode Algorithm Modification" filed by Zhang et al. on Oct. 28, 2011; or with that disclosed in "LDPC Decoder with Targeted Symbol Flipping" filed by Wang et al. on Oct. 17, 2011. The entirety of both of the aforementioned references was previously incorporated herein by reference for all purposes. Based upon the disclosure provided herein, one of ordinary skill in the art will recognize a variety of bit modification algorithms and/or circuitry that may be used in relation to different embodiments of the present invention. In addition, the modified bits or symbols are logged (block 290). This logging includes recording both the bit or symbols that have been modified, the original values, and during which local iteration the respective bit or symbol was modified. The processes of block 295 and those subsequent are performed.

Where, on the other hand, the decoded output converged (block 255), it is determined whether the decoded output includes a mis-correction (block 260). Such a determination of a mis-correction may be determined, for example, using cyclic redundancy check data included in the decoded output. A mis-correction has occurred where the cyclic redundancy checks are not satisfied. Where no mis-corrections are identified (block 265), the decoded output is provided as a hard decision output (block 280), and the process returns to block 240. Alternatively, where a mis-correction is identified (block 265), a subset of the logged modifications are rewound (block 270). Such rewinding involves reversing one or more previous bit or symbol modifications. In various embodiments of the present invention, the bits or symbols selected for return to their pre-modification values may be selected from the most recent local iteration or from a preceding local iteration of the low density parity check decoder algorithm. In one particular embodiment of the present invention, the bits or symbols selected for modification are those bits or symbols that have been previously modified (i.e., w) that are associated with the identified mis-correction (i.e., e) in the decoded output.

In addition to reversing the modification previously applied to the selected bits or symbols (block 270), the log likelihood ratios (i.e., soft data) associated with the respective bits or symbols are increased or set to relatively high values (block 275). Such an increase in the log likelihood ratios discourages future bit modification from again modifying the bit or symbol values and thereby limits the possibility of the same mis-corrected decoded output resulting from application of the low density parity check equation. In some cases, the log likelihood ratios of bits or symbols surrounding reversed bits symbols is reduced to further discourage resolution of future decoded output including the mis-corrections. With the bit modifications rewound or reversed, the processes of block 295 and those subsequent are performed.

Figure 3:
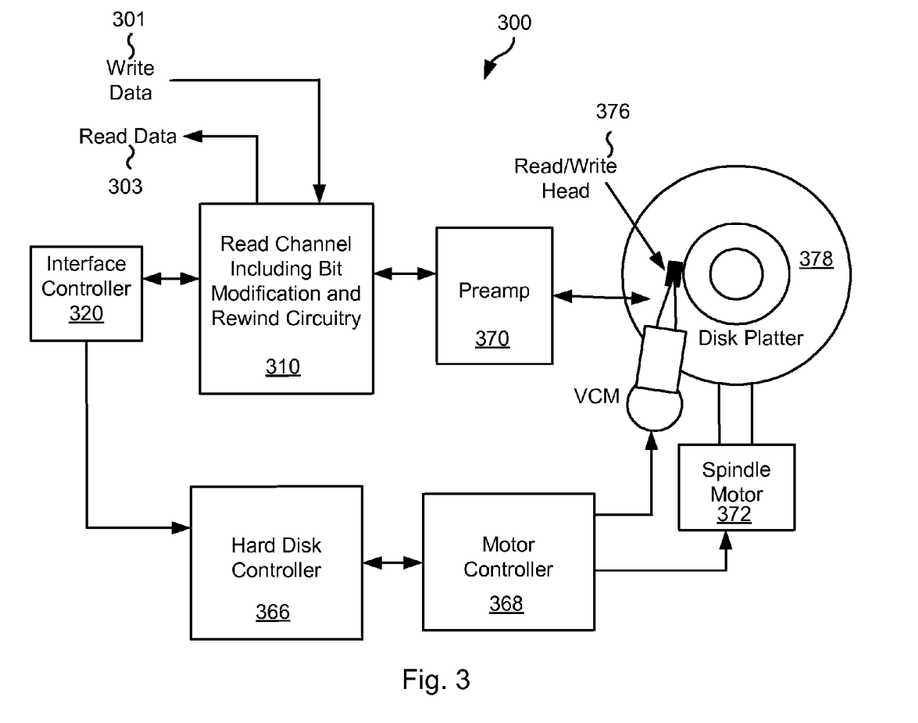
FIG. 3 shows a storage device including bit modification and rewind circuitry in accordance with one or more embodiments of the present invention.

Turning to FIG. 3, a storage device 300 is shown including bit modification and rewind circuitry in accordance with one or more embodiments of the present invention. Storage device 300 may be, for example, a hard disk drive. Storage device 300 also includes a preamplifier 370, an interface controller 320, a hard disk controller 366, a motor controller 368, a spindle motor 372, a disk platter 378, and a read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 378 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. A write operation is substantially the opposite of the preceding read operation with write data 301 being provided to read channel circuit 310. This data is then encoded and written to disk platter 378.

During operation, data decoding applied to the information received from disk platter 378 may converge, but include mis-corrections. Where it is determined that a mis-correction has occurred, one or more bits that were previously flipped as part of the decoding process are returned to an earlier state (i.e., rewound). The soft data associated with these "rewound" bits is increased to reduce the possibility of the bits being flipped again, and the process of decoding including bit modification is repeated and the low density parity check decoder algorithm is applied to the decoded output with the newly flipped bits. Such mis-correction identification and correction may be implemented similar to that discussed above in relation to FIG. 1, and/or may be done using a process similar to that discussed above in relation to FIG. 2.

It should be noted that storage system 300 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 300, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 310 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 4:
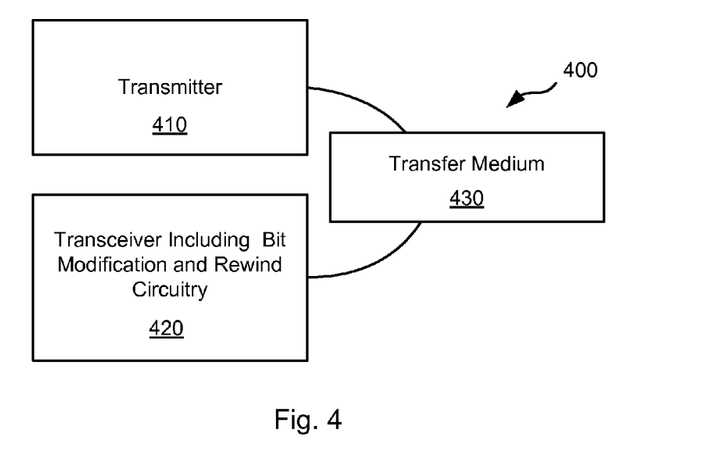
FIG. 4 shows a data transmission system including bit modification and rewind circuitry in accordance with various embodiments of the present invention.

Turning to FIG. 4, a data transmission system 400 including bit modification and rewind circuitry in accordance with one or more embodiments of the present invention. Data transmission system 400 includes a transmitter 410 that is operable to transmit encoded information via a transfer medium 430 as is known in the art. The encoded data is received from transfer medium 430 by a receiver 420. Receiver 420 incorporates data decoder circuitry. While processing received data, received data is converted from an analog signal to a series of corresponding digital samples, and the digital samples are equalized to yield an equalized output. The equalized output is then provided to a data processing circuit including both a data detector circuit and a data decoder circuit. Data is passed between the data decoder and data detector circuit via a central memory allowing for variation between the number of processing iterations that are applied to different data sets. It should be noted that transfer medium 430 may be any transfer medium known in the art including, but not limited to, a wireless medium, an optical medium, or a wired medium. Based upon the disclosure provided herein, one of ordinary skill in the art will recognize a variety of transfer mediums that may be used in relation to different embodiments of the present invention.

During operation, data decoding applied to the information received from transmission medium 430 may converge, but include mis-corrections. Where it is determined that a mis-correction has occurred, one or more bits that were previously flipped as part of the decoding process are returned to an earlier state (i.e., rewound). The soft data associated with these "rewound" bits is increased to reduce the possibility of the bits being flipped again, and the process of decoding including bit modification is repeated and the low density parity check decoder algorithm is applied to the decoded output with the newly flipped bits. Such mis-correction identification and correction may be implemented similar to that discussed above in relation to FIG. 1, and/or may be done using a process similar to that discussed above in relation to FIG. 2.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a data decoding circuit including:
      a data decoder circuit configured to: apply a data decode algorithm to a decoder input to yield a decoded output, apply the data decode algorithm to the decoder input guided by the decoded output to yield a first updated decoded output, and apply the data decode algorithm to the decoder input guided by a second updated decoded output to yield a third updated decoded output;
      an element modification circuit configured to modify at least one element within the first updated decoded output to yield the second updated decoded output;
      an element modification log configured to maintain a history of one or more modified elements within the second updated decoded output; and
      a mis-correction detection circuit configured to identify a mis-correction in the third updated decoded output and to return at least one of the modified elements in the third updated decoded output to a prior state to yield a fourth updated decoded output.

2. The data processing system of claim 1, wherein the data decoder circuit is further configured to apply the data decode algorithm to the decoder input guided by the fourth updated decoded output to yield a fifth updated decoded output.

3. The data processing system of claim 1, wherein the mis-correction detection circuit uses cyclic redundancy check information in the third updated decoded output to identify the mis-correction.

4. The data processing system of claim 1, wherein the data decoder circuit is a low density parity check decoder circuit, and wherein the data decode algorithm is a low density parity check decode algorithm.

5. The data processing system of claim 1, wherein the mis-correction detection circuit is further configured to modify soft data associated with the at least one of the modified elements to discourage future modification of the at least one of the modified elements.

6. The data processing system of claim 5, wherein the soft data is log likelihood ratio data.

7. The data processing system of claim 5, wherein the mis-correction detection circuit is further configured to modify soft data associated with at least one element other than the at least one of the modified elements to encourage future modification of the at least one element other than the at least one of the modified elements.

8. The data processing system of claim 1, wherein an element is selected from a group consisting of: a bit and a symbol.

9. The data processing circuit of claim 1, wherein the data processing system is implemented as part of a device selected from a group consisting of: a storage device, and a receiving device.

10. The data processing system of claim 1, wherein the data processing system is implemented as part of an integrated circuit.

11. The data processing system of claim 1, wherein the data processing system further comprises:
a data detector circuit configured to apply a data detection algorithm to an input data set to yield a detected output, wherein the decoder input is derived from the detector output.

12. A method for data processing, the method comprising:
applying a data decode algorithm to a decoder input guided by a first updated decoded output by a data decoder circuit to yield a second updated decoded output;
modifying at least one element of the second updated decoded output to yield a third updated decoded output;
storing a history including the modified one of the at least one element of the second updated decoded output to a memory;
applying the data decode algorithm to the decoder input guided by the third updated decoded output to yield a fourth updated decoded output wherein the fourth updated decoded output includes a mis-correction;
accessing the history from the memory;
based at least in part on the history, reversing the modification of the at least one element of the second updated decoded output to yield a fifth updated decoded output; and
applying the data decode algorithm to the decoder input guided by the fifth updated decoded output to yield a sixth updated decoded output.

13. The method of claim 12, wherein the method further comprises:
identifying the mis-correction using cyclic redundancy check information in the fourth updated decoded output.

14. The method of claim 12, wherein the data decoder circuit is a low density parity check decoder circuit, and wherein the data decode algorithm is a low density parity check decode algorithm.

15. The method of claim 12, wherein the method further comprises:
modifying soft data associated with the at least one element of the second updated decoded output to discourage future modification of the at least one element of the second updated decoded output.

16. The method of claim 12, wherein the method further comprises:
modifying soft data associated with at least one element other than the at least one element of the second updated decoded output to encourage future modification of the at least one element other than the at least one element of the second updated decoded output.

17. The method of claim 12, wherein an element is selected from a group consisting of: a bit and a symbol.

18. The method of claim 12, wherein the method further comprises:
applying a data detection algorithm to an input data set to yield a detected output, wherein the decoder input is derived from the detector output.

19. A storage device, the storage device comprising:
a storage medium;
a head assembly disposed in relation to the storage medium and configured to provide a sensed signal corresponding to information on the storage medium;
a read channel circuit including:
an analog to digital converter circuit configured to sample an analog signal derived from the sensed signal to yield a series of digital samples;
an equalizer circuit configured to equalize the digital samples to yield a data set;
a data detector circuit configured to apply a data detection algorithm to the data set to yield a detected output; and
a data decoding circuit including:
a data decoder circuit configured to: apply a data decode algorithm to a decoder input derived from the detected output to yield a decoded output, apply the data decode algorithm to the decoder input guided by the decoded output to yield a first updated decoded output, and apply the data decode algorithm to the decoder input guided by a second updated decoded output to yield a third updated decoded output;
an element modification circuit configured to modify at least one element within the first updated decoded output to yield the second updated decoded output;
an element modification log configured to maintain a history of one or more modified elements within the second updated decoded output; and
a mis-correction detection circuit configured to identify a mis-correction in the third updated decoded output and to return at least one of the modified elements in the third updated decoded output to yield a fourth updated decoded output.

20. The method of claim 19, wherein the mis-correction detection circuit is further configured to modify soft data associated with the at least one of the modified elements to discourage future modification of the at least one of the modified elements.

* * * * *